(12) United States Patent
Sugiyama

(10) Patent No.: US 12,244,273 B2
(45) Date of Patent: Mar. 4, 2025

(54) AMPLIFIER CIRCUIT

(71) Applicant: Murata Manufacturing Co., Ltd., Kyoto (JP)

(72) Inventor: Koudai Sugiyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 569 days.

(21) Appl. No.: 17/645,512

(22) Filed: Dec. 22, 2021

(65) Prior Publication Data

US 2022/0209723 A1 Jun. 30, 2022

(30) Foreign Application Priority Data

Dec. 25, 2020 (JP) .................. 2020-216143

(51) Int. Cl.
*H03F 3/19* (2006.01)
*H03F 1/22* (2006.01)

(52) U.S. Cl.
CPC .......... *H03F 3/19* (2013.01); *H03F 2200/451* (2013.01)

(58) Field of Classification Search
CPC ...... H03F 3/19; H03F 2200/451; H03F 1/223; H03F 1/26; H03F 3/193; H03F 3/211; H03F 1/565; H03F 2200/294
USPC ......................................... 330/277, 291, 310
See application file for complete search history.

(56) References Cited

U.S. PATENT DOCUMENTS

| | | | |
|---|---|---|---|
| 7,420,425 B2 * | 9/2008 | Tsai ................ | H03F 3/193 330/311 |
| 9,941,849 B1 * | 4/2018 | Ayranci ............ | H03H 7/38 |
| 2006/0119435 A1 * | 6/2006 | Oh .................. | H03F 3/191 330/311 |
| 2020/0177135 A1 | 6/2020 | Beppu | |

FOREIGN PATENT DOCUMENTS

WO 2019/031553 A1 2/2019

* cited by examiner

*Primary Examiner* — Hieu P Nguyen
(74) *Attorney, Agent, or Firm* — MCDONALD HOPKINS LLC

(57) ABSTRACT

An amplifier circuit includes an input terminal, an output terminal, an amplifier including a first transistor and a second transistor that are connected in parallel, a first capacitor, and a second capacitor, and an inductor. Each of the first transistor and the second transistor has a gate connected to the input terminal, a source connected to ground, and a drain connected to the output terminal. The inductor is provided between the input terminal and a node of parallel connection of the first transistor and the second transistor on the side of the input terminal. The first capacitor is arranged in a path connecting the node and the gate of the first transistor, the second capacitor is arranged in a path connecting the node and the gate of the second transistor, and the capacitance of the first capacitor differs from the capacitance of the second capacitor.

9 Claims, 4 Drawing Sheets

AMPLIFIER CIRCUIT

CROSS REFERENCE TO RELATED APPLICATION

This application claims priority from Japanese Patent Application No. 2020-216143 filed on Dec. 25, 2020. The content of this application is incorporated herein by reference in its entirety.

BACKGROUND ART

The present disclosure relates to amplifier circuits.

Hitherto, amplifier circuits, each including a first transistor circuit that includes a plurality of transistors connected in parallel, a second transistor circuit connected to the first transistor circuit in a cascode configuration, and a plurality of capacitors connected to the respective gates of the plurality of transistors, are disclosed (for example, International Publication No. 2019/031553 (patent document 1)). This enables adjustment of the gain by selectively supplying a bias to the plurality of transistors connected in parallel, which are included in the first transistor circuit, to change an effective transistor size of the first transistor circuit.

BRIEF SUMMARY

For example, in the amplifier circuit disclosed in the patent document 1, in the case where an inductor is arranged as an input matching circuit between an input terminal and a node of parallel connection of the plurality of transistors, degradation of noise figure (NF) can be suppressed by increasing the capacitances of the plurality of capacitors connected to this inductor. However, when the capacitances of the plurality of capacitors are increased uniformly, the size of the circuit may increase.

Accordingly, the present disclosure provides an amplifier circuit facilitating both suppression of NF degradation and suppression of circuit size increase.

An amplifier circuit according to an aspect of the present disclosure includes: an input terminal; an output terminal; an amplifier provided between the input terminal and the output terminal, the amplifier including a first transistor and a second transistor that are connected in parallel to one another, a first capacitor, and a second capacitor; and an inductor, wherein the first transistor has a first control terminal connected to the input terminal, a first terminal connected to ground, and a second terminal connected to the output terminal, the second transistor has a second control terminal connected to the input terminal, a third terminal connected to the ground, and a fourth terminal connected to the output terminal, the inductor is provided between the input terminal and a node of parallel connection of the first transistor and the second transistor on a side of the input terminal, the first capacitor is arranged in a path connecting the node and the first control terminal, the second capacitor is arranged in a path connecting the node and the second control terminal, and a capacitance of the first capacitor differs from a capacitance of the second capacitor.

Other features, elements, characteristics, and advantages of the present disclosure will become more apparent from the following detailed description of embodiments of the present disclosure with reference to the attached drawings.

DETAILED DESCRIPTION

Figure 1:
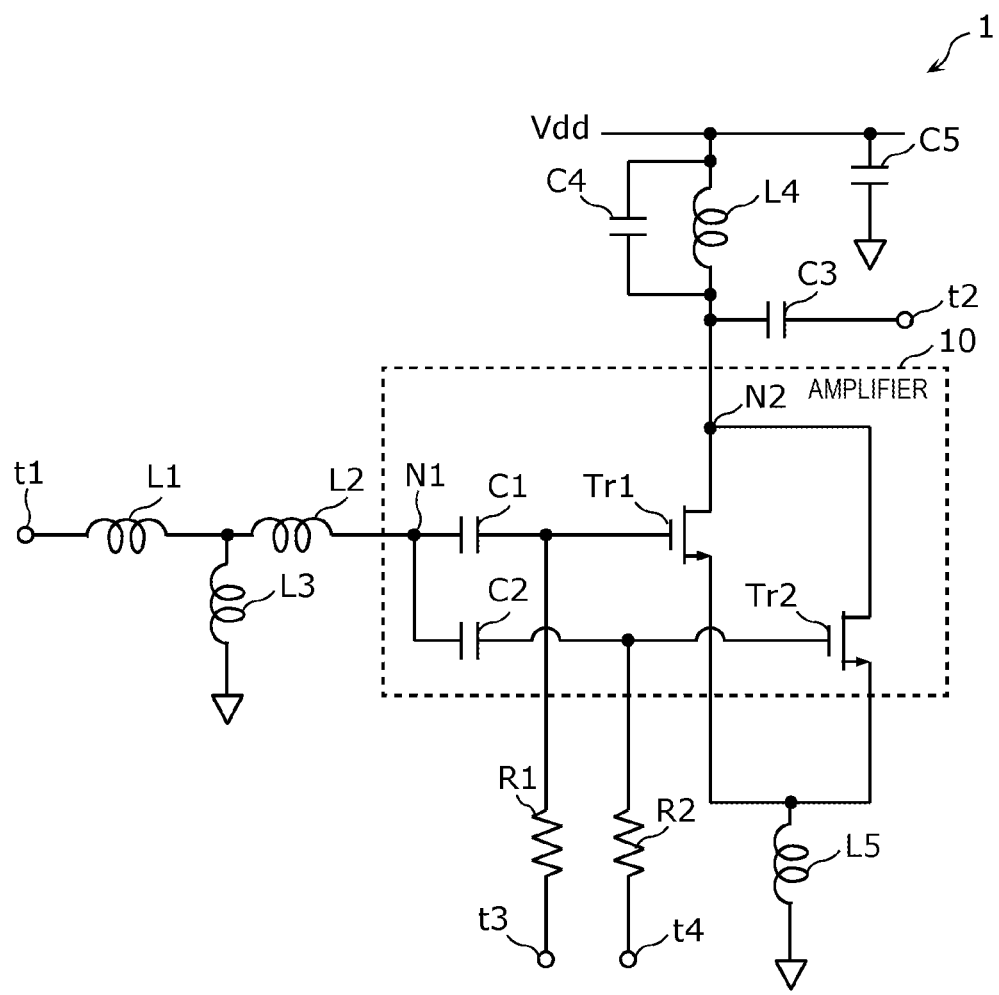
FIG. 1 is a circuit configuration diagram illustrating an example of an amplifier circuit according to Embodiment 1.

Details That Led to an Aspect of the Present Disclosure

First, details that led to an aspect of the present disclosure are described.

In order to realize an amplifier circuit with a lower NF, the Q-factor of an inductor can be used as a matching circuit of the amplifier circuit. However, in the case where the inductor is fabricated in such a manner as not to exceed a restricted size, if a larger inductance is to be achieved, the Q-factor will decrease and the NF will degrade. Relaxation of the size restriction can increase the Q-factor of the inductor. However, this increases the size and the cost of the amplifier circuit.

In this case, by increasing the capacitance of a capacitor to be used as a matching circuit of the amplifier circuit, the inductance of the inductor can be reduced. That is to say, NF degradation can be suppressed by increasing the Q-factor of the inductor. However, a capacitor with a larger capacitance has a larger size, and again this increases the size and the cost of the amplifier circuit. Particularly, as is the case with the amplifier circuit disclosed in the foregoing patent document 1, in the case where an amplifier circuit includes a plurality of transistors and a plurality of capacitors connected to the plurality of transistors, the size of the amplifier circuit will further increase if the capacitances of the plurality of capacitances are increased uniformly.

In view of the above, in the following section, an amplifier circuit that facilitates both suppression of NF degradation and suppression of circuit size increase is described.

Hereinafter, embodiments of the present disclosure will be described in detail using the drawings. Note that the embodiments, which will be described below, each illustrates a comprehensive or specific example. Numeric values, shapes, materials, constituent elements, arrangements and connection modes of the constituent elements, and the like illustrated in the following embodiments are mere examples and not intended to limit the present disclosure. Of constituent elements in the following embodiments, the constituent elements that are not described in an independent claim will be described as optional constituent elements. Further, sizes or ratios of the sizes of constituent elements illustrated in the drawings are not necessarily exact ones. Further, in the drawings, the same reference code is given to substantially the same constituent element, and an overlapping description thereof is omitted or simplified in some cases. Further, in the following embodiments, the term "connect" is defined to include not only the case where elements are connected directly but also the case where elements are electrically connected via another element (for example, a capacitor, an inductor, or the like). Further, that "an element is arranged in a path" means that the element is inserted in the path.

Embodiment 1

Embodiment 1 is described using FIG. 1.

Circuit Configuration

FIG. 1 is a circuit configuration diagram illustrating an example of an amplifier circuit 1 according to Embodiment 1.

The amplifier circuit 1 is a circuit that amplifies an input radio frequency signal and outputs the amplified radio frequency signal. The amplifier circuit 1 may be a low-noise amplifier (LNA) or a power amplifier (PA). The amplifier circuit 1 includes an input terminal t1, an output terminal t2, and bias terminals t3 and t4. The input terminal t1 is a terminal that receives an input radio frequency signal, and the output terminal t2 is a terminal from which the amplified radio frequency signal is output. The bias terminals t3 and t4 are each a terminal to which a bias is input.

The amplifier circuit 1 includes an amplifier 10, inductors L1, L2, L3, L4, and L5, capacitors C3, C4, and C5, and resistors R1 and R2.

The amplifier 10 is provided between the input terminal t1 and the output terminal t2. The amplifier 10 includes transistors Tr1 and Tr2 connected in parallel to each other, a capacitor C1, and a capacitor C2. The transistor Tr1 is an example of a first transistor, the transistor Tr2 is an example of a second transistor, the capacitor C1 is an example of a first capacitor, and the capacitor C2 is an example of a second capacitor.

The transistor Tr1 is arranged in a path connecting the input terminal t1 and the output terminal t2. The transistor Tr1 is, for example, formed on a semiconductor substrate. The transistor Tr1 has a first control terminal connected to the input terminal t1, a first terminal connected to ground, and a second terminal connected to the output terminal t2. The first control terminal is a gate or a base, the first terminal is a source or an emitter, and the second terminal is a drain or a collector. For example, the transistor Tr1 is a metal oxide semiconductor field effect transistor (MOSFET), and in this case, the first control terminal is the gate, the first terminal is the source, and the second terminal is the drain.

The gate of the transistor Tr1 is connected to the input terminal t1 via the inductors L1 and L2 and the capacitor C1 and to the bias terminal t3 via the resistor R1. The source of the transistor Tr1 is connected to the ground via the inductor L5. The drain of the transistor Tr1 is connected to the output terminal t2 via the capacitor C3 and to a power Vdd via the inductor L4 and the capacitor C4.

The transistor Tr2 is arranged in the path connecting the input terminal t1 and the output terminal t2. The transistor Tr2 is, for example, formed on a semiconductor substrate. The transistor Tr2 has a second control terminal connected to the input terminal t1, a third terminal connected to the ground, and a fourth terminal connected to the output terminal t2. The second control terminal is a gate or a base, the third terminal is a source or an emitter, and the fourth terminal is a drain or a collector. For example, the transistor Tr2 is a MOSFET, and in this case, the second control terminal is the gate, the third terminal is the source, and the fourth terminal is the drain.

The gate of the transistor Tr2 is connected to the input terminal t1 via the inductors L1 and L2 and the capacitor C2 and to the bias terminal t4 via the resistor R2. The source of the transistor Tr2 is connected to the ground via the inductor L5. The drain of the transistor Tr2 is connected to the output terminal t2 via the capacitor C3 and to the power Vdd via the inductor L4 and the capacitor C4.

The transistor Tr1 and the transistor Tr2 are connected in parallel by connecting the gate of the transistor Tr1 and the gate of the transistor Tr2 and connecting the drain of the transistor Tr1 and the drain of the transistor Tr2.

For example, the size of the transistor Tr1 is larger than the size of the transistor Tr2. Specifically, the ratio of gate width to gate length (WL ratio of the gate) of the transistor Tr1 is larger than the WL ratio of the gate of the transistor Tr2. The transistor Tr1 having a larger size has a relatively large gain and is more suitable for amplifying a relatively small radio frequency signal, and thus, in many cases, a lower NF is desired. The transistor Tr2 having a smaller size has a relatively small gain and is more suitable for amplifying a relatively large radio frequency signal, and thus, in many cases, a lower NF is not desired. Note that in the case where the transistors Tr1 and Tr2 are bipolar transistors, the sizes of the transistors Tr1 and Tr2 may be compared in terms of the ratio of base width to base length (WL ratio of the base).

The inductors L1, L2, and L3 are examples of the inductor to be provided between the input terminal t1 and a node N1 of parallel connection of the transistors Tr1 and Tr2 on the side of the input terminal t1. The node N1 is the node of the gate of the transistor Tr1 and the gate of the transistor Tr2. The inductor provided between the input terminal t1 and the node N1 may be an inductor arranged in a path connecting the input terminal t1 and the node N1 or an inductor connected between a node in the path and the ground.

The inductor L1 is arranged in the path connecting the input terminal t1 and the node N1. The inductor L1 constitutes an input matching circuit for matching the input impedance of the transistors Tr1 and Tr2. The inductor L1 may be formed on the semiconductor substrate, on which the transistors Tr1 and Tr2 are formed, in a coil-like shape or a spiral-like shape.

The inductor L2 is connected in series to the inductor L1 in the path connecting the input terminal t1 and the node N1. The inductor L2 constitutes the input matching circuit for matching the input impedance of the transistors Tr1 and Tr2. The inductor L2 may be formed on the semiconductor substrate, on which the transistors Tr1 and Tr2 are formed, in a coil-like shape or a spiral-like shape.

The inductor L3 is connected between the ground and a node in the path connecting the input terminal t1 and the node N1 (specifically, a node in a path connecting the inductor L1 and the inductor L2). The inductor L3 constitutes the input matching circuit for matching the input impedance of the transistors Tr1 and Tr2. The inductor L3 may be formed on the semiconductor substrate, on which the transistors Tr1 and Tr2 are formed, in a coil-like shape or a spiral-like shape.

The capacitor C1 is arranged in a path connecting the node N1 and the gate of the transistor Tr1. The capacitor C1 constitutes an input matching circuit for matching the input impedance of the transistor Tr1. Further, the capacitor C1 functions as a DC-cut capacitor that prevents a bias, which is input to the bias terminal t3, from leaking to the input terminal t1. The capacitor C1 may be formed on the semiconductor substrate on which the transistors Tr1 and Tr2 are formed.

The capacitor C2 is arranged in a path connecting the node N1 and the gate of the transistor Tr2. The capacitor C2 constitutes an input matching circuit for matching the input impedance of the transistor Tr2. Further, the capacitor C2 functions as a DC-cut capacitor that prevents a bias, which is input to the bias terminal t4, from leaking to the input terminal t1. The capacitor C2 may be formed on the semiconductor substrate on which the transistors Tr1 and Tr2 are formed.

The capacitance of the capacitor C1 differs from the capacitance of the capacitor C2. For example, the capacitors C1 and C2 having capacitances different from each other are different in electrode shape or electrode size. Having the different capacitances means, for example, that the capacitance of one capacitor and the capacitance of the other capacitor differ by more than or equal to about 5%. In other words, in the case where the difference between the capacitance of the one capacitor and the capacitance of the other capacitor is less than about 5%, it may be considered that the capacitances of these capacitors are the same. For example, the capacitance of the capacitor C1 to be connected to the transistor Tr1 having a larger size is larger than the capacitance of the capacitor C2 to be connected to the transistor Tr2 having a smaller size.

Further, because a wiring line has an inductance component, a wiring line connecting the node N1 and the capacitor C1 and a wiring line connecting the node N1 and the capacitor C2 can be used for impedance matching. In this case, for example, the wiring length of the wiring line connecting the node N1 and the capacitor C1 may be shorter than the wiring length of the wiring line connecting the node N1 and the capacitor C2. That is to say, the inductance component of the wiring line connecting the node N1 and the capacitor C1 may be smaller than the inductance component of the wiring line connecting the node N1 and the capacitor C2.

The capacitor C3 is arranged in a path connecting the output terminal t2 and a node N2 of parallel connection of the transistors Tr1 and Tr2 on the side of the output terminal t2. The node N2 is a node of the drain of the transistor Tr1 and the drain of the transistor Tr2. The capacitor C3 constitutes an output matching circuit for matching the output impedance of the transistors Tr1 and Tr2. Further, the capacitor C3 functions as a DC-cut capacitor that prevents a DC current from the power Vdd from leaking to the output terminal t2.

The capacitor C4 is arranged in a path connecting the node N2 and the power Vdd. The capacitor C4 constitutes the output matching circuit for matching the output impedance of the transistors Tr1 and Tr2.

The inductor L4 is connected in parallel to the capacitor C4 in a path connecting the node N2 and the power Vdd. The inductor L4 constitutes the output matching circuit for matching the output impedance of the transistors Tr1 and Tr2. Further, the inductor L4 functions as a choke inductor to be connected to the power Vdd.

The capacitor C5 is connected between the power Vdd and the ground. The capacitor C5 functions as a bypass capacitor, and in some cases, the capacitor C5 constitutes the output matching circuit for matching the output impedance of the transistors Tr1 and Tr2.

The inductor L5 is connected between the ground and the sources of the transistors Tr1 and Tr2. The inductor L5 is a source degeneration inductor for improving the linearity of the transistors Tr1 and Tr2.

A bias resistor for supplying a bias is connected to each of the gate of the transistor Tr1 and the gate of the transistor Tr2.

The resistor R1 is a bias resistor arranged in a path connecting the gate of the transistor Tr1 and the bias terminal t3.

The resistor R2 is a bias resistor arranged in a path connecting the gate of the transistor Tr2 and the bias terminal t4.

In the amplifier 10, the transistor to be used for amplification may be switched between the transistors Tr1 and Tr2. For example, the transistor Tr1 may be used for amplification while the transistor Tr2 may not be used for amplification, or the transistor Tr2 may be used for amplification while the transistor Tr1 may not be used for amplification. Alternatively, both the transistors Tr1 and Tr2 may be used for amplification.

For example, as a method of switching the transistor to be used for amplification between the transistors Tr1 and Tr2, there is a method that uses a bias control.

It is possible not to activate a transistor by not supplying a bias to the gate of the transistor. For example, a radio frequency signal can be amplified using the transistor Tr1 by supplying a bias to the gate of the transistor Tr1 and not supplying a bias to the gate of the transistor Tr2. For example, a radio frequency signal can be amplified using the transistor Tr2 by supplying a bias to the gate of the transistor Tr2 and not supplying a bias to the gate of the transistor Tr1. For example, a radio frequency signal can be amplified using both the transistors Tr1 and Tr2 by supplying biases to the gates of the transistors Tr1 and Tr2. Note that in the case where both the transistors Tr1 and Tr2 are used for amplification, the bias supplied to the gate of the transistor Tr1 may differ from the bias supplied to the gate of the transistor Tr2.

Note that in the case where the transistor Tr1 is used for amplification, a minute bias smaller than the bias supplied to the transistor Tr1 may be supplied to the transistor Tr2, and in the case where the transistor Tr2 is used for amplification, a minute bias smaller than the bias supplied to the transistor Tr2 may be supplied to the transistor Tr1.

Further, for example, as the method of switching the transistor to be used for amplification between the transistors Tr1 and Tr2, there is a method that uses a switch control. This will be described later.

Further, the transistor Tr1 may be a bipolar transistor. In this case, the first control terminal is the base, the first terminal is the emitter, and the second terminal is the collector. Further, the transistor Tr2 may be a bipolar transistor. In this case, the second control terminal is the base, the third terminal is the emitter, and the fourth terminal is the collector. In the foregoing description and the following description, the gate may be replaced with the base, the source may be replaced with the emitter, and the drain may be replaced with the collector.

Effects and the Like

The amplifier circuit 1 includes the input terminal t1, the output terminal t2, the amplifier 10 that is provided between the input terminal t1 and the output terminal t2 and that includes the transistors Tr1 and Tr2 connected in parallel to each other, the capacitor C1, and the capacitor C2, and the inductor L1, L2, or L3. The transistor Tr1 has the gate connected to the input terminal t1, the source connected to the ground, and the drain connected to the output terminal t2, and the transistor Tr2 has the gate connected to the input terminal t1, the source connected to the ground, and the drain connected to the output terminal t2. The inductor L1, L2, or L3 is provided between the input terminal t1 and the node N1 of parallel connection of the transistors Tr1 and Tr2 on the side of the input terminal t1. The capacitor C1 is arranged in the path connecting the node N1 and the gate of the transistor Tr1, the capacitor C2 is arranged in the path connecting the node N1 and the gate of the transistor Tr2, and the capacitance of the capacitor C1 differs from the capacitance of the capacitor C2.

According to this, the capacitance of one of the capacitors C1 and C2 is made smaller. This enables suppression of circuit size increase, compared with the case where the capacitances of the capacitors C1 and C2 are increased uniformly. Further, because the capacitance of one of the capacitors C1 and C2 is made larger, it is possible to suppress NF degradation.

As described above, by making the capacitance of the capacitance C1 different from the capacitance of the capacitor C2, it is possible to realize the amplifier circuit 1 that facilitates both suppression of NF degradation and suppression of circuit size increase.

For example, the size of the transistor Tr1 may be larger than the size of the transistor Tr2, and the capacitance of the capacitor C1 may be larger than the capacitance of the capacitor C2.

The transistor Tr1 having a larger size has a relatively large gain and is more suitable for amplifying a relatively small radio frequency signal, and thus, in many cases, a lower NF is desired. Because of this, by increasing the capacitance of the capacitor C1 to be connected to the transistor Tr1, it is possible to realize a lower NF. On the other hand, the transistor Tr2 having a smaller size has a relatively small gain and is more suitable for amplifying a relatively large radio frequency signal, and thus, in many cases, a lower NF is not desired. Because of this, the capacitance of the capacitor C2 to be connected to the transistor Tr2 can be reduced. This enables the suppression of NF degradation and the suppression of circuit size increase efficiently.

For example, the wiring length of the wiring line connecting the node N1 and the capacitor C1 may be shorter than the wiring length of the wiring line connecting the node N1 and the capacitor C2.

This enables offset of a shortfall of the inductance component to provide input impedance matching of the transistor Tr2, which corresponds to a reduced amount of the capacitance of the capacitor C2, by extending the wiring length of the wiring line connecting the node N1 and the capacitor C2.

For example, in the amplifier 10, the transistor to be used for amplification may be switched between the transistors Tr1 and Tr2.

This enables usage of, of the transistors Tr1 and Tr2, the more suitable transistor for amplification depending on the situation.

For example, in the case where a relatively small radio frequency signal is amplified, the transistor Tr1 having a larger size is used for amplification, and in many cases, a lower NF is desired. Because the capacitance of the capacitor C1 connected to the transistor Tr1 is larger, the inductance desired for the inductor L1, L2, or L3 is smaller, and this enables increase of the Q-factor achievable with a restricted size. This enables achievement of a lower NF using the capacitor C1 having a larger capacitance while keeping the gain at a certain level or higher, which is needed to amplify a relatively small radio frequency signal.

For example, in the case where a relatively large radio frequency signal is amplified, the transistor Tr2 having a smaller size and a lower current consumption is used for amplification, and in this case, a lower NF is often not desired. Because a lower NF is not desired, the capacitance of the capacitor C2 to be connected to the transistor Tr2 may be made smaller, and this enables realization of a lower current consumption and a smaller circuit size.

As described above, in the case where the transistor Tr1 for a larger gain is used for amplification, the capacitance of the capacitor C1 to be connected to the transistor Tr1 is larger, and this enables reduction of the NF. Whereas, in the case where the transistor Tr2 for a smaller gain is used for amplification, the capacitance of the capacitor C2 to be connected to the transistor Tr2 is smaller, and this enables reduction of the circuit size. Therefore, it is possible to realize the amplifier circuit 1 that is compatible with a larger gain and a smaller gain and that also facilitates both suppression of NF degradation and suppression of circuit size increase.

Note that both the transistors Tr1 and Tr2 or a plurality of transistors including the transistors Tr1 and Tr2 may be used for amplification, and this enables design of an amplifier circuit having any gain, any NF, and any current consumption by using any combination of transistors to be used for amplification from the plurality of transistors. In this case, by making the capacitances of capacitors to be connected to the respective transistors different from each other, it is possible to improve flexibility in design. Specifically, the capacitance of each capacitor may be adjusted in such a way that each transistor has a most suitable input impedance when the transistor is operated individually or when the transistor is operated simultaneously with another transistor.

For example, the resistor R1 and the resistor R2 for supplying biases may be connected to the gate of the transistor Tr1 and the gate of the transistor Tr2, respectively.

A time constant such as a circuit start-up time, a switch control switching time, or the like is determined based on the resistors R1 and R2 and the capacitors C1 and C2 for supplying biases. In the present disclosure, the capacitance of one of the capacitors C1 and C2 is made smaller, and this enables reduction of the time constant and shorten the circuit start-up time, the switch control switching time, or the like, compared with the case where the capacitances of the capacitors C1 and C2 are increased uniformly.

For example, the transistors Tr1 and Tr2 and the capacitors C1 and C2 may be formed on a semiconductor substrate.

According to this, by forming the capacitors C1 and C2 on a semiconductor substrate, it is possible to reduce the sizes of the capacitors C1 and C2 and, as a result, to reduce the size of the amplifier circuit 1.

For example, the inductor L1, L2, or L3 may be formed on a semiconductor substrate in a coil-like shape.

In the case where the inductor formed on a semiconductor substrate in a coil-like shape is formed in such a manner as to have substantially the same inductance (specifically, the same number of turns) as in the case where an external inductor is used, the number of turns is increased within the restricted size. Thus, it is likely to have a narrower line width and a smaller Q-factor. However, in the present disclosure, the required inductance can be reduced in the first place. Thus, the number of turns may not be increased so much, and this is less likely to pose any problem even in the case where the inductors are formed on a semiconductor substrate. In other words, the present disclosure enables provision of a choice to form an inductor on a semiconductor substrate. Accordingly, in the case where the inductor L1, L2, or L3 is formed on a semiconductor substrate in a coil-like shape, the present disclosure can be applied usefully.

Embodiment 2

Figure 2:
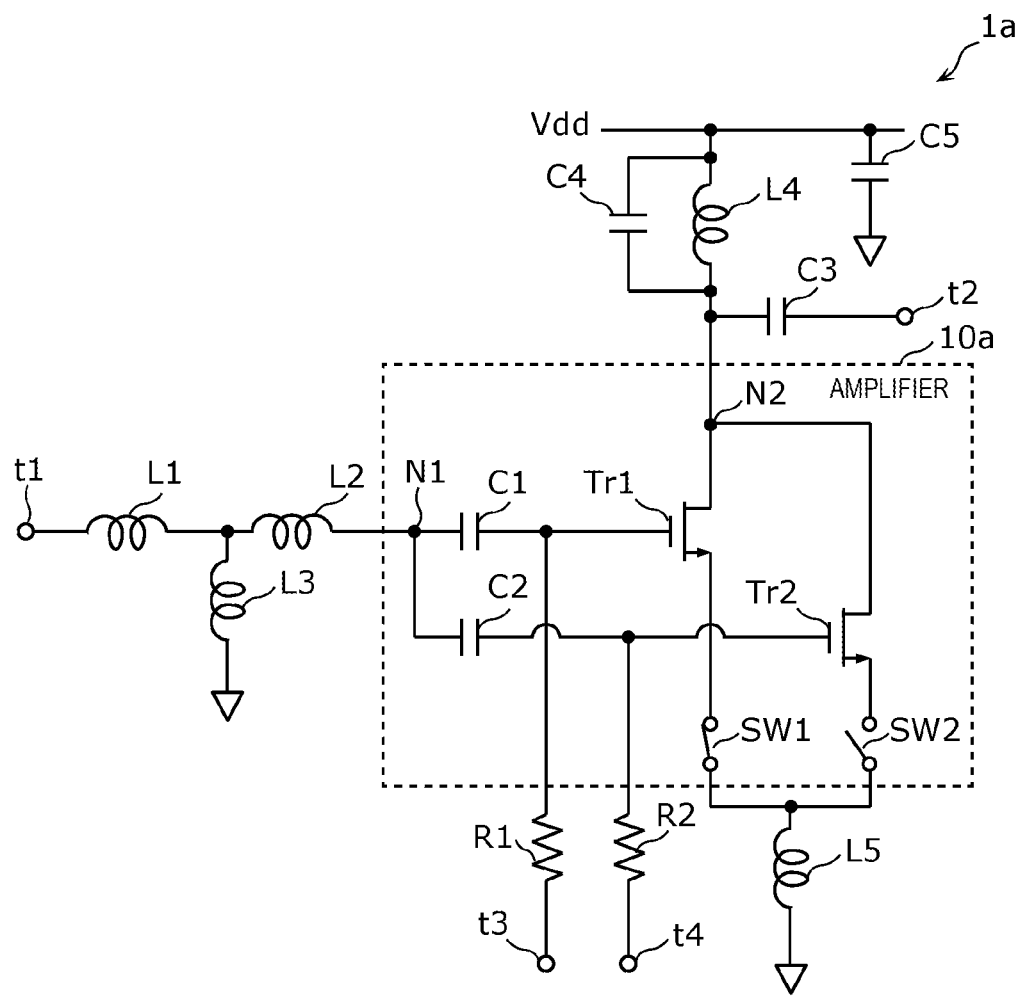
FIG. 2 is a circuit configuration diagram illustrating an example of an amplifier circuit according to Embodiment 2.

Next, Embodiment 2 is described using FIG. 2.
Circuit Configuration

FIG. 2 is a circuit configuration diagram illustrating an example of an amplifier circuit 1a according to Embodiment 2.

The amplifier circuit 1a according to Embodiment 2 differs from the amplifier circuit 1 according to Embodiment 1 in that an amplifier 10a is included in place of the amplifier 10. The remaining points are the same as those of Embodiment 1, and thus descriptions thereof are omitted. Further, the amplifier 10a differs from the amplifier 10 according to Embodiment 1 in that switches SW1 and SW2 are further included. The remaining points are the same as those of Embodiment 1, and thus descriptions thereof are omitted.

The switch SW1 is connected to the source of the transistor Tr1, and the switch SW2 is connected to the source of the transistor Tr2.

For example, as the method of switching the transistor to be used for amplification between the transistors Tr1 and Tr2, there is a method that uses a switch control.

The switch SW1 is a series switch arranged in a path connecting the source of the transistor Tr1 and the ground, and the switch SW2 is a series switch arranged in a path connecting the source of the transistor Tr2 and the ground. For example, a radio frequency signal can be amplified using the transistor Tr1 by turning the switch SW1 to the electrically continuous state and turning the switch SW2 to the electrically discontinuous state. For example, a radio frequency signal can be amplified using the transistor Tr2 by turning the switch SW1 to the electrically discontinuous state and turning the switch SW2 to the electrically continuous state. For example, a radio frequency signal can be amplified using both the transistors Tr1 and Tr2 by turning both the switches SW1 and SW2 to the electrically continuous state.

As described above, the transistor to be used for amplification may be switched between the transistors Tr1 and Tr2 by controlling the switches. Note that as the method of switching the transistor to be used for amplification between the transistors Tr1 and Tr2, both the method that uses a bias control and the method that uses a switch control may be used. For example, in the case where the transistor Tr1 is used for amplification, a bias may be supplied to the gate of the transistor Tr1, and the switch SW1 may be turned to the electrically continuous state.

Embodiment 3

Figure 3:
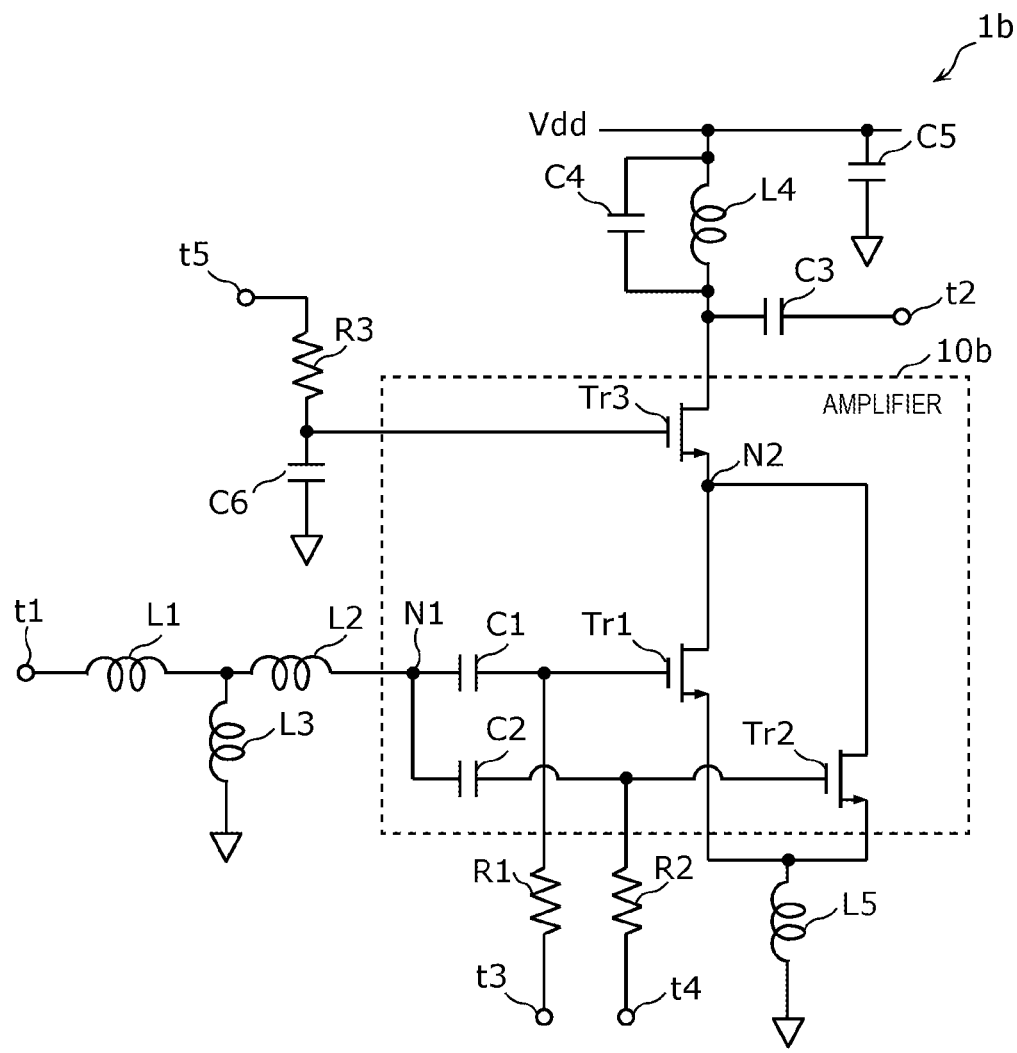
FIG. 3 is a circuit configuration diagram illustrating an example of an amplifier circuit according to Embodiment 3.

Next, Embodiment 3 is described using FIG. 3.
Circuit Configuration

FIG. 3 is a circuit configuration diagram illustrating an example of an amplifier circuit 1b according to Embodiment 3.

The amplifier circuit 1b according to Embodiment 3 differs from the amplifier circuit 1 according to Embodiment 1 in that an amplifier 10b is included in place of the amplifier 10 and that a bias terminal t5, a resistor R3, and a capacitor C6 are further included. The remaining points are the same as those of Embodiment 1, and thus descriptions thereof are omitted. Further, the amplifier 10b differs from the amplifier 10 according to Embodiment 1 in that the transistor Tr3 is further included. The remaining points are the same as those of Embodiment 1, and thus descriptions thereof are omitted.

The bias terminal t5 is a terminal to which a bias is input.

The transistor Tr3 is an example of a third transistor connected to the transistor Tr1 and the transistor Tr2 in a cascode configuration. For example, the transistor Tr3 is arranged in a path connecting the node N2 and the output terminal t2, and the transistors Tr1, Tr2, and Tr3 constitute a cascode amplifier. For example, the transistor Tr3 is a MOSFET. The drain of the transistor Tr1 and the drain of the transistor Tr2 are connected to the output terminal t2 via the transistor Tr3.

The gate of the transistor Tr3 is connected to the bias terminal t5 via the resistor R3 and to the ground via the capacitor C6. The source of the transistor Tr3 is connected to the drain of the transistor Tr1 and the drain of the transistor Tr2. The drain of the transistor Tr3 is connected to the output terminal t2 via the capacitor C3 and to the power Vdd via the inductor L4 and the capacitor C4.

The capacitor C6 is a bias capacitor connected between the ground and a node in a path connecting the gate of the transistor Tr3 and the bias terminal t5.

The resistor R3 is a bias resistor arranged in the path connecting the gate of the transistor Tr3 and the bias terminal t5.

Note that the transistor Tr3 may be arranged in a path connecting the drain of the transistor Tr1 and the node N2, and the transistors Tr1 and Tr3 may constitute a cascode amplifier. Further, the transistor Tr3 may be arranged in a path connecting the drain of the transistor Tr2 and the node N2, and the transistors Tr2 and Tr3 may constitute a cascode amplifier.

Note that the transistor Tr3 may be a bipolar transistor, and in the foregoing description and the following description, the gate, the source, and the drain of the transistor Tr3 may be replaced with the base, the emitter, and the collector.
Effects and the Like For example, the amplifier 10b may further include the transistor Tr3 connected to the transistors Tr1 and Tr2 in a cascode configuration.

This enables the realization of the amplifier circuit 1b capable of having a still larger gain.

Embodiment 4

Figure 4:
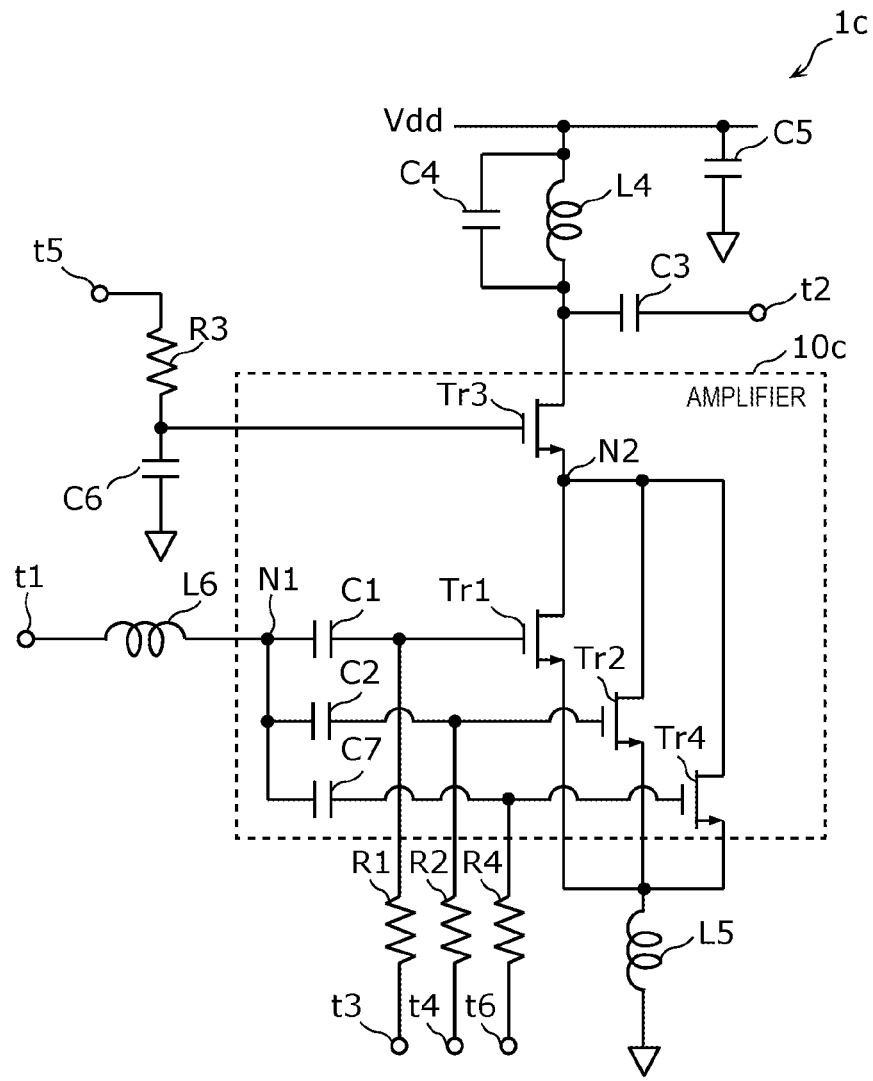
FIG. 4 is a circuit configuration diagram illustrating an example of an amplifier circuit according to Embodiment 4.

Next, Embodiment 4 is described using FIG. 4.
Circuit Configuration

FIG. 4 is a circuit configuration diagram illustrating an example of an amplifier circuit 1c according to Embodiment 4.

The amplifier circuit 1c according to Embodiment 4 differs from the amplifier circuit 1b according to Embodiment 3 in that an amplifier 10c is included in place of the amplifier 10b, that an inductor L6 is included in place of the inductors L1, L2, and L3, and that a bias terminal t6 and a resistor R4 are further included. The remaining points are the same as those of Embodiment 3, and thus descriptions thereof are omitted. Further, the amplifier 10c differs from the amplifier 10b according to Embodiment 3 in that a transistor Tr4 and a capacitor C7 are further included. The remaining points are the same as those of Embodiment 3, and thus descriptions thereof are omitted.

The bias terminal t6 is a terminal to which a bias is input.

The transistor Tr4 is arranged in the path connecting the input terminal t1 and the output terminal t2. For example, the transistor Tr4 is a MOSFET.

The gate of the transistor Tr4 is connected to the input terminal t1 via the inductor L6 and the capacitor C7 and to the bias terminal t6 via the resistor R4. Note that in Embodiment 4, the gate of the transistor Tr1 is connected to the input terminal t1 via the inductor L6 and the capacitor C1, and the gate of the transistor Tr2 is connected to the input terminal t1 via the inductor L6 and the capacitor C2. The source of the transistor Tr4 is connected to the ground via the inductor L5. The drain of the transistor Tr4 is connected to the output terminal t2 via the transistor Tr3 and the capacitor C3 and to the power Vdd via the transistor Tr3, the inductor L4, and the capacitor C4.

The transistor Tr1, the transistor Tr2, and the transistor Tr4 are connected in parallel by connecting the gate of the transistor Tr1, the gate of the transistor Tr2, and the gate of the transistor Tr4 and connecting the drain of the transistor Tr1, the drain of the transistor Tr2, and the drain of the transistor Tr4.

The inductor L6 is an example of the inductor to be provided between the input terminal t1 and the node N1 of parallel connection of the transistors Tr1, Tr2, and Tr4 on the side of the input terminal t1. The inductor L6 is arranged in the path connecting the input terminal t1 and the node N1. The inductor L6 constitutes an input matching circuit for matching the input impedance of the transistors Tr1, Tr2, and Tr4. As described above, the inductor L6 may be provided between the input terminal t1 and the node N1.

The capacitor C7 is arranged in a path connecting the node N1 and the gate of the transistor Tr4. The capacitor C7 constitutes an input matching circuit for matching the input impedance of the transistor Tr4. Further, the capacitor C7 functions as a DC-cut capacitor that prevents a bias, which is input to the bias terminal t6, from leaking to the input terminal t1.

The capacitance of the capacitor C1, the capacitance of the capacitor C2, and the capacitance of the capacitor C7 are different from each other.

The resistor R4 is a bias resistor arranged in a path connecting the gate of the transistor Tr4 and the bias terminal t6.

Note that the transistor Tr4 may be a bipolar transistor, and in the foregoing description and the following description, the gate, the source, and the drain of the transistor Tr4 may be replaced with the base, the emitter, and the collector.

As is the case with the amplifier circuit 1c according to Embodiment 4, three or more transistors connected in parallel to each other may be included, and even in this case, as is the case with Embodiment 1 and the like, by making the capacitances of the capacitors, which are connected to the respective transistors, different from each other, it is possible to realize an amplifier circuit facilitating both suppression of NF degradation and suppression of circuit size increase.

OTHER EMBODIMENTS

The amplifier circuits according to the present disclosure have been described above using the embodiments. However, the present disclosure is not limited to the foregoing embodiments. Other embodiments realized by combining optional constituent elements of the foregoing embodiments, modified examples obtained by applying various modifications apparent to those skilled in the art to the foregoing embodiments without necessarily departing the scope of the present disclosure, and various devices including the amplifier circuit according to the present disclosure may also be included in the present disclosure.

For example, the foregoing embodiments are described using the examples in which the size of the transistor Tr1 is larger than the size of the transistor Tr2 and the capacitance of the capacitor C1 is larger than the capacitance of the capacitor C2. However, the present disclosure is not limited to those embodiments. For example, in the cases where the size of the transistor Tr1 is larger than the size of the transistor Tr2, the capacitance of the capacitor C1 may be smaller than the capacitance of the capacitor C2.

For example, the foregoing embodiments are described using the examples in which the wiring length of the wiring line connecting the node N1 and the capacitor C1 is shorter than the wiring length of the wiring line connecting the node N1 and the capacitor C2. However, the present disclosure is not limited to those embodiments. For example, the wiring length of the wiring line connecting the node N1 and the capacitor C1 may be longer than or equal to the wiring length of the wiring line connecting the node N1 and the capacitor C2.

For example, the foregoing embodiments are described using the examples in which the transistor to be used for amplification is switched between the transistors Tr1 and Tr2. However, the transistor to be used for amplification may not need to be switched.

For example, the foregoing embodiments are described using the examples in which the transistors Tr1 and Tr2 and the capacitors C1 and C2 are formed on a semiconductor substrate. However, the transistors Tr1 and Tr2 and the capacitors C1 and C2 may not need to be formed on a semiconductor substrate.

For example, the foregoing embodiments are described using the examples in which the inductor L1, L2, or L3 is formed on a semiconductor substrate in a coil-like shape. However, the inductor L1, L2, or L3 may not need to be formed on a semiconductor substrate in a coil-like shape.

As an amplifier circuit that amplifies a radio frequency signal, the present disclosure is widely applicable to communication devices such as mobile phones and the like.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. An amplifier circuit comprising:
an input terminal;
an output terminal;
an amplifier between the input terminal and the output terminal, the amplifier comprising a first transistor and a second transistor that are connected to each other in parallel, a first capacitor, and a second capacitor; and
an inductor,
wherein the first transistor has a first control terminal connected to the input terminal, a first terminal connected to ground, and a second terminal connected to the output terminal,
wherein the second transistor has a second control terminal connected to the input terminal, a third terminal connected to ground, and a fourth terminal connected to the output terminal,
the control terminal of the first transistor is connected to the control terminal of the second transistor at a first node,
the inductor is connected between the input terminal and the first node,
the first capacitor is connected in series in a first path that connects the first node to the first control terminal,
the second capacitor is connected in series in a second path that connects the first node to the second control terminal, and a capacitance of the first capacitor is different than a capacitance of the second capacitor.

2. The amplifier circuit according to claim 1, wherein:
a size of the first transistor is larger than a size of the second transistor, and
the capacitance of the first capacitor is larger than the capacitance of the second capacitor.

3. The amplifier circuit according to claim 2, wherein a length of a first wiring line that connects the first node to the first capacitor is shorter than a length of a second wiring line that connects the first node to the second capacitor.

4. The amplifier circuit according to claim 1, wherein in the amplifier, the first transistor and the second transistor are selectively connected as operational amplification transistors.

5. The amplifier circuit according to claim 1, wherein the first terminal of the first transistor and the third terminal of the second transistor are configured to be selectively connected to ground.

6. The amplifier circuit according to claim 1, further comprising:
a first bias resistor and a second bias resistor connected to the first control terminal and the second control terminal, respectively,
wherein the first and second bias resistors are configured to supply a bias to the first and second transistors, respectively.

7. The amplifier circuit according to claim 1, wherein the amplifier further comprises:
a third transistor connected to the first transistor and to the second transistor in a cascode configuration.

8. The amplifier circuit according to claim 1, wherein the first transistor, the second transistor, the first capacitor, and the second capacitor are on a semiconductor substrate.

9. The amplifier circuit according to claim 1, wherein the inductor is on a semiconductor substrate in a coil-like shape.

\* \* \* \* \*